United States Patent [19]

Kimura et al.

[11] Patent Number: 4,998,161
[45] Date of Patent: Mar. 5, 1991

[54] LDD MOS DEVICE HAVING AN ELEMENT SEPARATION REGION HAVING AN ELECTROSTATIC SCREENING ELECTRODE

[75] Inventors: Hiroshi Kimura; Shinichi Satoh; Hiroji Ozaki; Yoshinori Tanaka; Wataru Wakamiya, all of Hyogo, Japan

[73] Assignee: Mitsubishi Denki Kabushiki Kaisha, Tokyo, Japan

[21] Appl. No.: 446,560

[22] Filed: Dec. 5, 1989

[30] Foreign Application Priority Data

Dec. 8, 1988 [JP] Japan ................................ 63-312423

[51] Int. Cl.⁵ ..................... H01L 29/10; H01L 29/78; H01L 29/34
[52] U.S. Cl. ................................. 357/23.4; 357/23.3; 357/23.14; 357/52
[58] Field of Search ..................... 357/23.3, 23.14, 52, 357/23.4

[56] References Cited

U.S. PATENT DOCUMENTS 4,868,617 9/1989 Chiao et al. .................. 357/23.14 X

FOREIGN PATENT DOCUMENTS 62-33470 2/1987 Japan .
62-241375 10/1987 Japan .

OTHER PUBLICATIONS

Kroell et al., "Field Shield MOS Transistor with Self-Aligned Gate", IBM Tech. Disc. Bulletin, vol. 16, No. 6, Nov. 1973, pp. 1860-1861.

Paul J. Tsang et al., "Fabrication of High Performance LDDFET's with Oxide Sidewall Spacer Technology", IE³ Transactions Electron Device, vol. ED-29, No. 4, Apr. 1982, pp. 590-596.

*Primary Examiner*—Rolf Hille
*Assistant Examiner*—Roy Potter
*Attorney, Agent, or Firm*—Lowe, Price, LeBlanc, Becker & Shur

[57] ABSTRACT

In an element forming region (10) of a semiconductor substrate (1), there are provided a gate electrode (2), sidewall insulating films (4), impurity diffusion regions (5a and 5b) of a lower concentration having their one ends are overlapped with the side sections of the gate electrode (2), and impurity diffusion regions (6a and 6b) of a higher concentration having their one ends are overlapped with the side sections of the sidewall insulating films (4). In an element isolation region (7) of the semiconductor substrate, there are formed an electrostatic screening electrode (31) for element isolation and an insulating film (30) substantially enclosing the electrostatic screening electrode. By employing the electrostatic screening electrode (31) for element isolation in the LDD MOS transistor, there is obtained a semiconductor device of high performance and reliability which is free from intrusion of impurities from the element isolation region.

20 Claims, 6 Drawing Sheets

LDD MOS DEVICE HAVING AN ELEMENT SEPARATION REGION HAVING AN ELECTROSTATIC SCREENING ELECTRODE

BACKGROUND OF THE INVENTION

1. Field of the Invention

This invention relates to a lightly doped drain (LDD) MOS device and, more particularly, to an LDD MOS device having an element separation region having an electrostatic screening electrode.

1. Description of the Background Art

The LDD MOS transistor is disclosed in a Japanese Patent Laying Open No. 62-241375, No. 62-33470 and "Fabrication of High-Performance LDDFET'S with Oxide Sidewall-Spacer Technology" IE[3] TRANSACTIONS ELECTRON DEVICE, Vol. ED-29, No. 4, April 1982, pp. 590-596.

FIG. 1 shows an LDD MOS transistor disclosed in this gazette or publication and forming the background of the present invention. In FIG. 1, a gate electrode 2 is formed through a gate insulating film 3 on a planar surface of a P-type semiconductor substrate. A sidewall or a sidewall insulating film 4 is formed in contact with each sidewall of this gate electrode 2. A pair of N-type first diffusion layers 5a and 5b forming source and drain region are formed on a planar surface of the semiconductor substrate 1 on both sides of the gate electrode 2 so that one end of each of the layers 5a and 5b is overlapped with the side section of the gate electrode. A pair of N-type second diffusion layers 6a and 6b forming source and drain regions are formed on the above planar surface of the semiconductor substrate 1 on both sides of the gate electrode 2 so that one end of each of the layers 6a and 6b is overlapped with the side section of said sidewall insulating film 4 but is not overlapped with the gate electrode 2. These second diffusion layers 6a and 6b are the diffusion layers in which the impurities are diffused at a higher concentration than in the first diffusion layers 5a and 5b. The N-type diffusion layers 5a, 5b, 6a and 6b, surface regions of the p-type semiconductor substrate between the diffusion layers 5a and 6a and the diffusion layers 5b and 6b, the gate insulating film on the surface region and the gate electrode on the gate insulating film constitute a P-type field effect transistor.

In an element isolation region 7, a selective oxide film 8 is formed by a LOCOS method (Method of Local Oxidation of Silicon), and a P-type impurity diffusion layer 9 is formed below the selective oxide film 8 for preventing field inversion of the element separation region 7. The numeral 10 denotes an element forming region including source and drain regions and a gate electrode.

The operation of the above described P-type field-effect transistor is explained below. FIG. 2A is a sectional view of the LDD MOS transistor of FIG. 1, looking in the direction shown by an arrow mark Y. In FIG. 2A, when the potential of the source region 6a is fixed, the voltage (+) is applied to the drain region 6b, the potential (−) is applied to the semiconductor substrate and the potential (+) is applied to the gate electrode 2 to operate this transistor, the electrons, produced in an inversion layer in response to the gate voltage, and acting as carriers, are migrated toward the drain as indicated by the arrow mark Id due to the electrical field between the source and the drain regions.

Referring to FIG. 2B, in the case of a transistor or an ordinary MOS transistor other than LDD type transistor, in which the impurity diffusion layer 6b' of the drain region is not formed by impurities of the lower concentration, but by impurities of the higher concentration, and this high concentration impurity region 6b' is overlapped with the gate electrode 2, the electrical field produced in the vicinity of the drain region 6b' becomes stronger as the distance between the source region 6a' and the drain region 6b' becomes shorter with reduction in size of the transistor. Thus, in such a case, the carrier electrons collide against the atoms within the semiconductor substrate 1 within a drain depletion region 11 produced by this electrical field, to cause ionization to produce electron-positive hole pairs. Among these electron-positive hole pairs, those electrons having an energy in excess of the potential barrier of a approximately 3.1eV presented by the interface between Si substrate 1 and $SiO_2$ insulating layer 3, are turned into hot electrons and injected into a silicon oxide film 3. A portion of the injected electrons are captured in the oxide film and act as electrical charges to produce the effect of increasing the gate threshold voltage of the transistor. This results in deteriorated characteristics and operational reliability of the transistor.

For preventing the lowering of the operational reliability and the deterioration of the characteristics of the transistor, there is known an LDD MOS transistor shown in FIGS. 1 and 2A in which the impurity diffusion layer 5b has a low impurity concentration. That is, the impurity concentration of the drain region 5b overlapped with the gate electrode for reducing the electrical field in the vicinity of the drain regions 5b and 6b to prevent hot electrons from being produced.

However, in the conventional LDD MOS transistor, the process of element separation is performed by the LOCOS method, so that, as shown in FIG. 3, which is a sectional view of the transistor seen from the direction X in FIG. 1, when the selective oxidation film 8 is oxidized at higher temperatures, the P-type impurities 14 are introduced by diffusion, as shown by arrow marks in FIG. 3, from the P-type impurity diffusion layer 9 provided below the selective oxide film 8 into source and drain impurity diffusion layers 5a, 5b, 6a, 6b and into a channel 17 of the transistor. In FIG. 3, a region shown by a broken line 15 represents a region into which the impurities are intruded. As a result of the introduction of impurities, the concentration of the impurities is increased at the boundary between the element forming region 10 and the element separation region 7 and, above all, at a channel boundary region in the vicinity of the LDD structure 16 of the transistor, to cause an increase in the gate threshold voltage, known as the narrow channel effect, so that the advantages of employing the LDD structure in the drain of the transistor cannot be exploited efficiently. This effect becomes most evident particularly when the channel length of the LDD MOS transistor is less than 1 micron.

In the above described LDD MOS transistor, when the channel length becomes smaller than 1 micron, the effect of intrusion of impurities from the element separation region into the element forming regions becomes conspicuous with the result that the advantages of employing the LDD structure in the drain cannot be exploited sufficiently and hence the characteristics and the operational reliability of the transistor cannot be maintained.

It should be noted that the above, background isolation structure uses an insulator to provide isolation between devices, an isolation structure using a conductor held at a potential below a threshold which permits conductivity between FET devices such as is disclosed in U.S. patent application Ser. No. 376,660 filed on July 7, 1989 by Wakamiya et al. assigned to Mitsubishi Denki Kabushiki Kaisha. However, such isolation has not been used in combination with LDE structures having the known advantages of such devices and particularly at the short channel lengths to which this invention is directed. This combination including an LDD structure provides the additional advantage of permitting further reduction in transistor size by reduction of channel width in a manner which is consistent with avoidance of the narrow channel effect, as described above.

SUMMARY OF THE INVENTION

It is an object of the present invention to provide a high reliability semiconductor device in which intrusion of the impurities from the element separation region into the element forming region of the LDD MOS transistor is eliminated and the properties of the LDD structure may be exploited efficiently to prevent the transistor characteristics from being lowered.

According to the present invention there is provided semiconductor device comprising a semiconductor substrate including a plurality of element forming regions in each of which a semiconductor element is formed, and an element isolation region surrounding the periphery of the element forming regions for isolating the element forming regions. A gate electrode is formed on the element forming region by way of a gate insulating film. Sidewall insulating films are formed in contact with the terminal ends of the gate electrode. First impurity diffusion regions of a lower concentration are formed on the surfaces of the element forming regions. The diffusion regions extend from the element isolation region to the vicinity of the gate electrode. Second impurity diffusion regions of a higher concentration are formed on the surfaces of the element forming regions. The diffusion layers extend from the element isolation region to the vicinity of the sidewall insulating isolation films. The element isolation region is formed on the surface of said semiconductor substrate by way of an insulating film and including an electrostatic screening electrode layer for electrostatically screening adjacent ones of the element forming regions from one another.

According to another aspect of the present invention, the semiconductor device includes word lines, bit lines extending orthogonally to the word lines, and memory cells formed in the element forming region at the intersection between the word lines and the bit lines.

The electrostatic screening electrode layer to which a constant voltage is applied at all times prevents the current from flowing between the LDD transistor elements of adjacent transistors. The use of an electrostatic screening electrode to replace the isolation structure of the background art provides a combination structure which eliminates the intrusion of the impurities into element forming regions during fabrication of the device to prevent the characteristics of the LDD transistor from being deteriorated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Among the semiconductor devices, the DRAM (Dynamic Random Access Memory) makes it possible to enter or output the data as desired. In general, the DRAM is made up of an array of memory cells which is a storage region for storing a large mass of information, and peripheral circuits necessary for inputting and outputting data.

Figure 4:
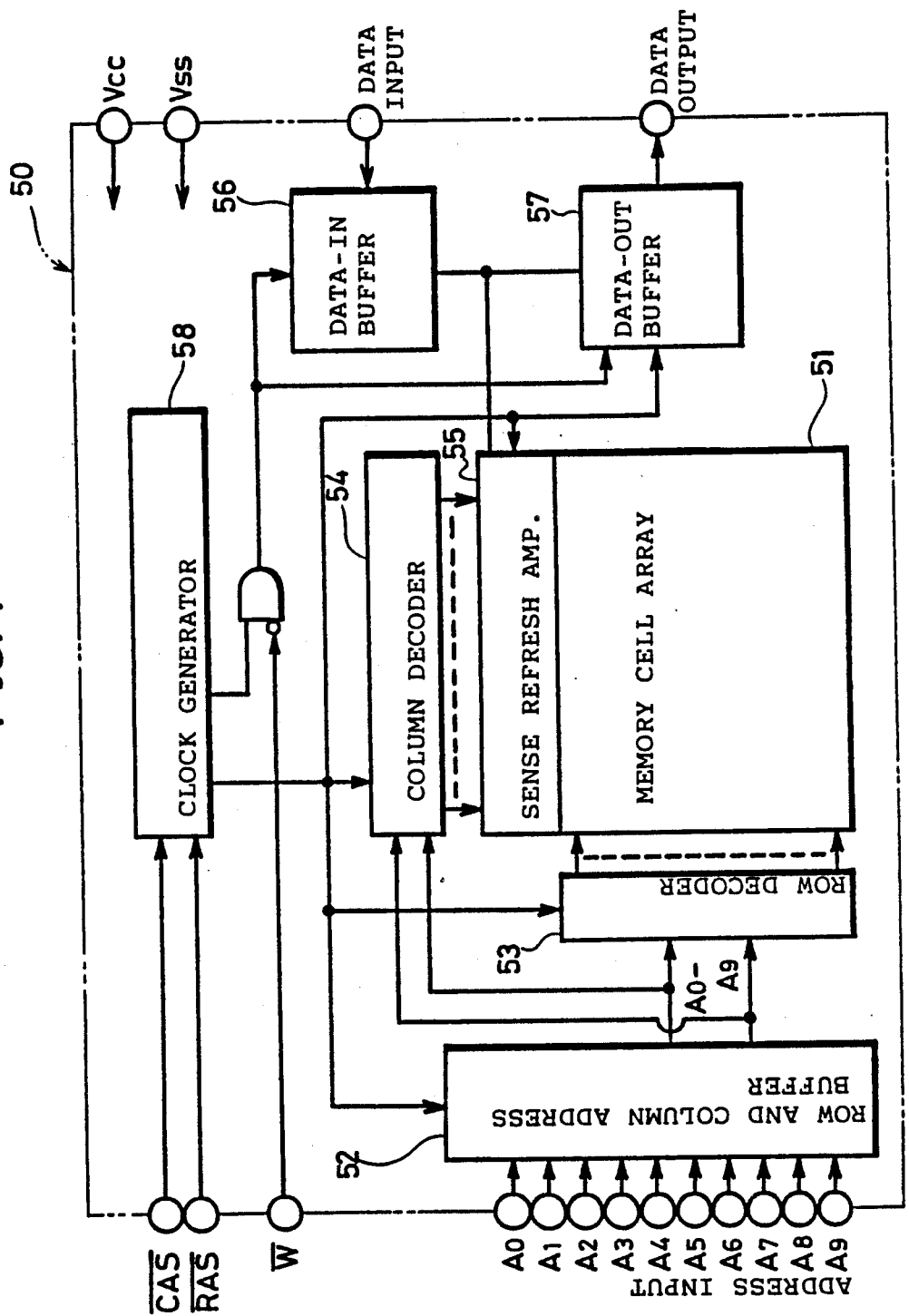
FIG. 4 is a block diagram showing the arrangement of a DRAM to which an embodiment of the present invention is applied.

FIG. 4 is a block diagram showing general arrangement of a DRAM. Referring to FIG. 4, the DRAM 50 includes a memory cell array 51 for storing data signals of the information to be stored, a row and column address buffer 52 for receiving address signals from outside for selecting a memory cell, a row decoder 53 and a column decoder 54 for designating the memory cell by decoding this address signal, a sense amplifier 55 for amplifying and reading out signals stored in the designated memory cell, a data-in buffer 56 and a data-out buffer 57 for inputting and outputting data and a block generator 58 for generating clock signals.

The memory cell array 51, occupying a large space on a semiconductor chip, is formed by a plurality of memory cells each adapted for a storing a unit formation to be stored.

Figure 5:
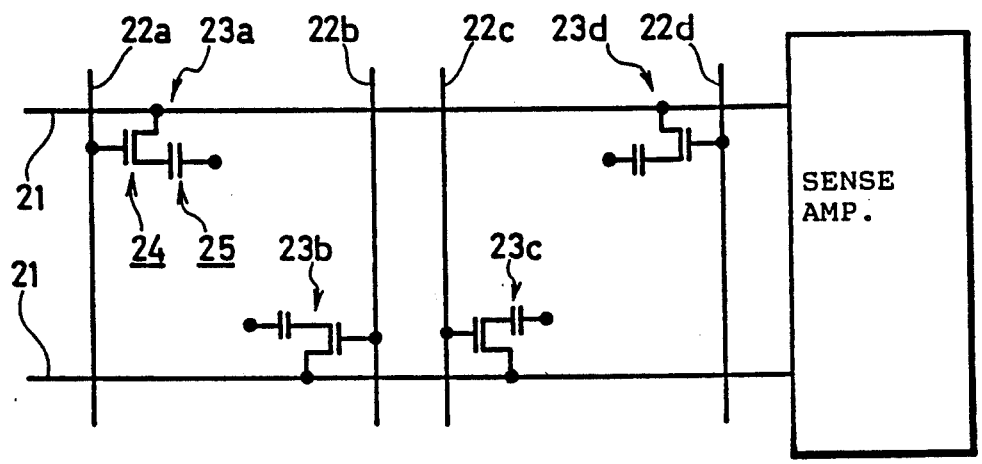
FIG. 5 is an equivalent circuit diagram showing a portion of the array of memory cells of the DRAM shown in FIG. 4.
Figure 6:
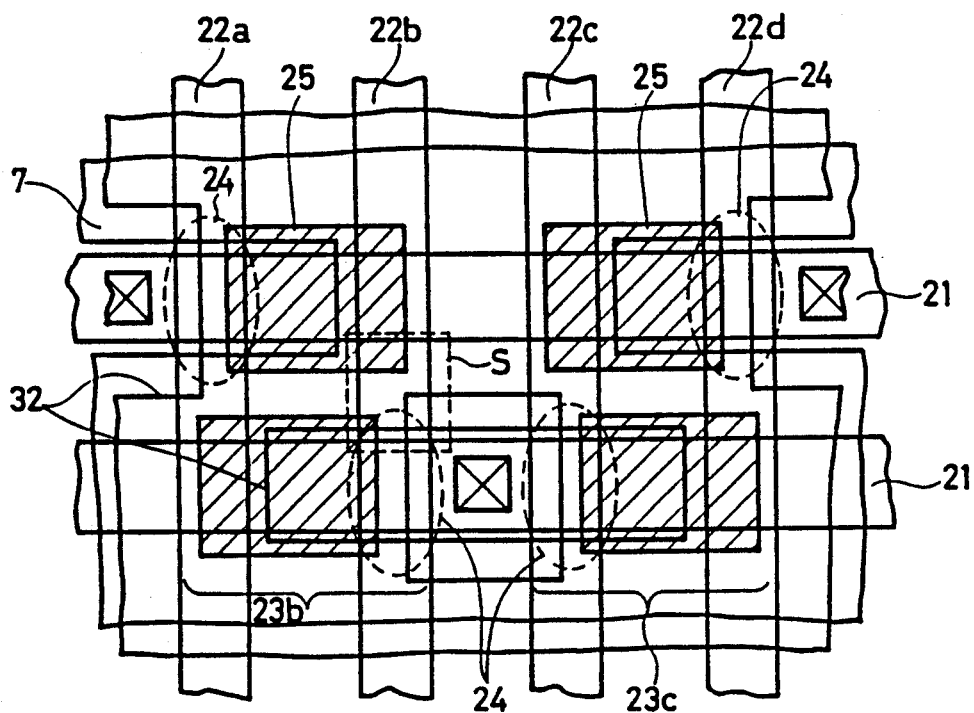
FIG. 6 is a plan view showing the structure of the array of memory cells shown in FIG. 5.

FIG. 5 is an equivalent circuit diagram for 4 bits of the memory cells constituting the memory cell array 51. FIG. 6 is a plan view showing a typical arrangement of the memory cell array. Referring to FIGS. 5 and 6, the memory cell array is made up of bit lines 21 and word lines 22a, 22b, 22c, 22d (corresponding to gate electrode 2) extending orthogonally thereto. Memory cells 23a to 23d are formed in the vicinity of the intersections between the bit lines 21 and the word lines 22a to 22d. Each memory cell is made up of an access transistor 24 and a capacitor 25. Reference number 32 depicts the boundary of screening electrodes 31 shown in FIG. 7 and, hence, the approximately boundary of the isolation region 7 and the limit of the element forming region 10.

Figure 1:
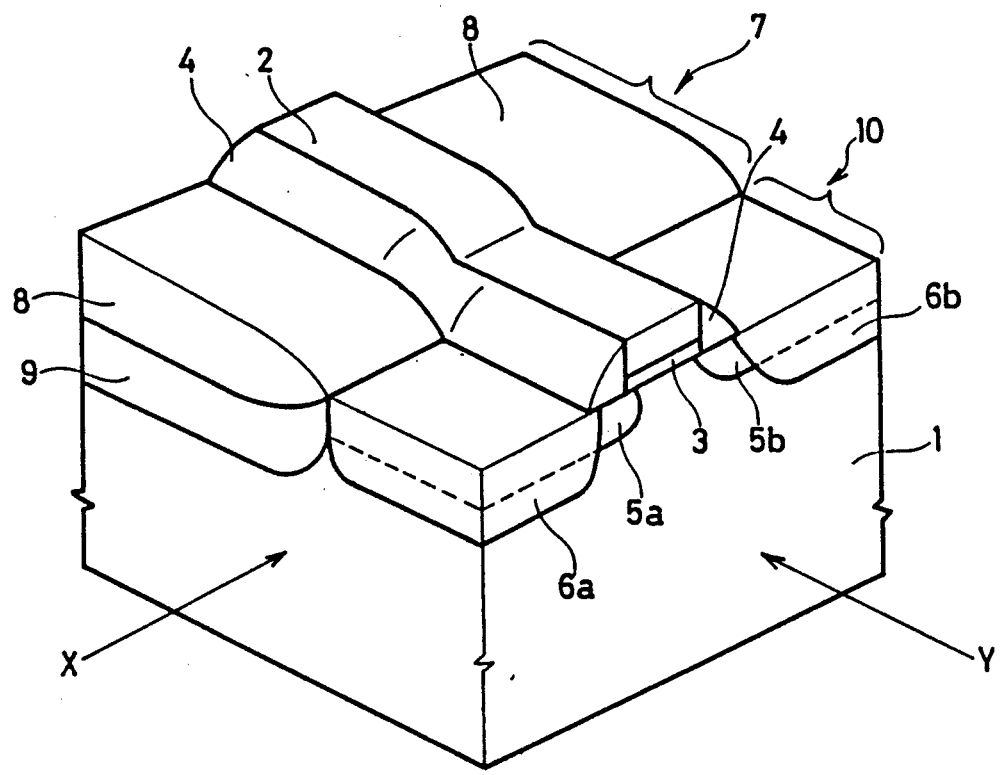
FIG. 1 is a perspective view showing a LDD MOS transistor forming the background of the present invention.
Figure 2A:
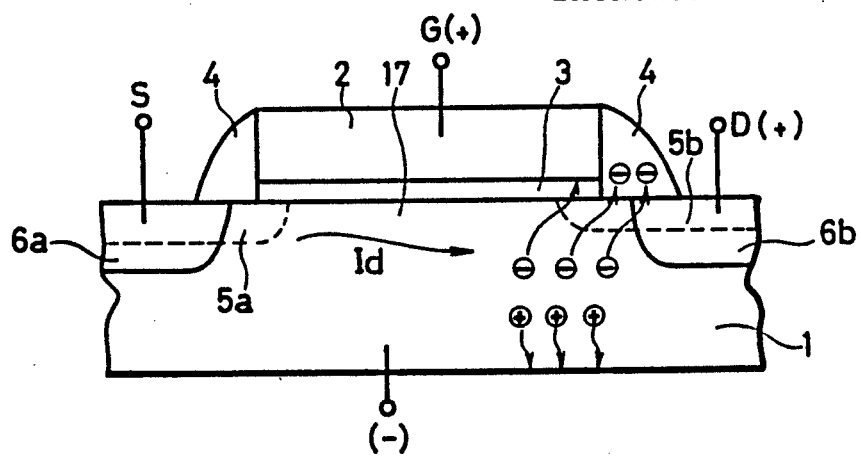
FIG. 2A is a sectional view of the LDD transistor shown in FIG. 1, looking in the Y direction.
Figure 2B:
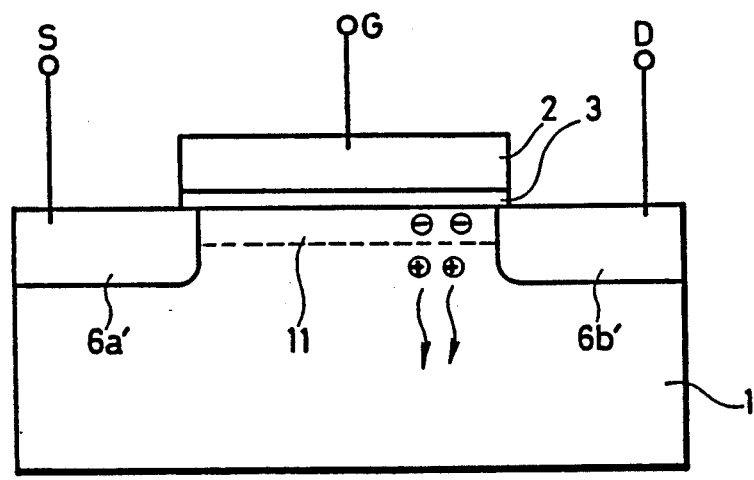
FIG. 2B is a cross sectional view illustrating the principle of generation of hot electrons in a single drain structure.
Figure 7:
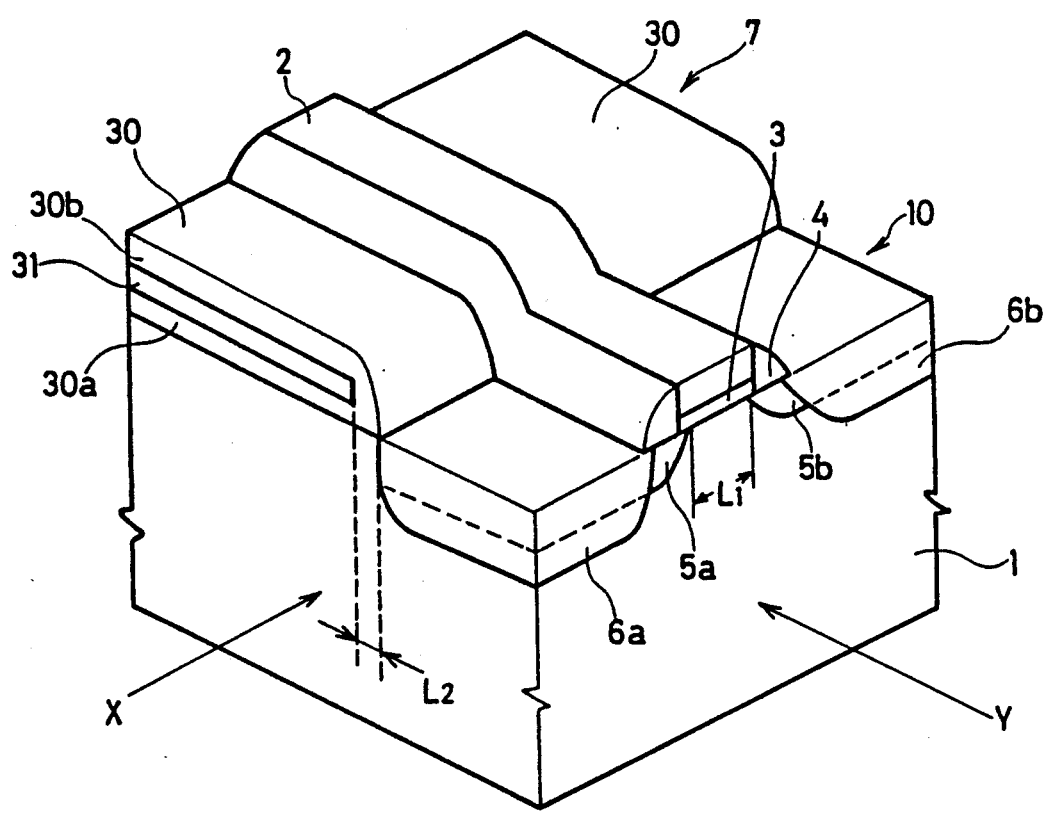
FIG. 7 is a perspective view of a LDD MOS transistor at a region S of FIG. 6 according to the invention.

FIG. 7 is a perspective view of a region S in FIG. 6, wherein the capacitor is omitted for simplifying the illustration. The semiconductor device shown in FIG. 7 differs from the semiconductor device shown in FIG. 1 in that an electrostatic screening electrode 31 for element separation and an insulating film 30 for substantially enclosing the electrostatic screening electrode 31 are provided in the element separation region 7. The device shown in FIG. 7 is otherwise the same as that shown in FIG. 1, so that the same or corresponding parts are indicated by the same reference numerals as in FIG. 1 and the corresponding description is not repeated. The insulating film has its lower portion 30a adapted for insulating the electrostatic screening electrode 31 from the semiconductor substrate 1 and its upper and lateral portion 30b adapted for insulating the electrostatic screening electrode 31 from the gate electrode 2 and the element forming region 10 including the gate electrode and the source drain region.

Referring to FIG. 7, the length of the channel L1 below the gate electrode 3 is 0.5 to 1.0μm, and the space L2 between the electrostatic screening electrode 31 and the diffusion layers 5a and 6a is 0.1 to 0.2μm. The size of the element forming region 10 (only a portion of which is shown in FIG. 7) surrounded by the element separating region 7 is 0.5 to 1.0μm. The insulating film 30 is formed of $SiO_2$, $Si_3N_4$, polyimide or the like, the thickness of the lower portion 30a is 0.01 to 0.1μm and the thickness of the upper portion 30b is 0.1 to 0.5μm. The gate electrode 2 is a film of polysilicon, a metal having high melting point or an alloy of the metal having high melting point, or a composite film including a polysilicon film and a film of metal having high melting point, the thickness of which is 0.01 to 0.5μm. When polysilicon is used, impurities such as P, As or the like may be mixed or diffused therein. The first diffusion layers 5a and 5b are formed with impurities such as As, Sb, P introduced and diffused to the concentration of $10^{12}$ to $10^{14}$ cm$^{-2}$. The second diffusion layers 6a and 6b are formed with the similar impurities introduced and diffused to the concentration of $10^{14}$ to $10^{16}$ cm$^{-2}$. In a P channel transistor, impurities such as Al, Ga, B are introduced.

Figure 8:
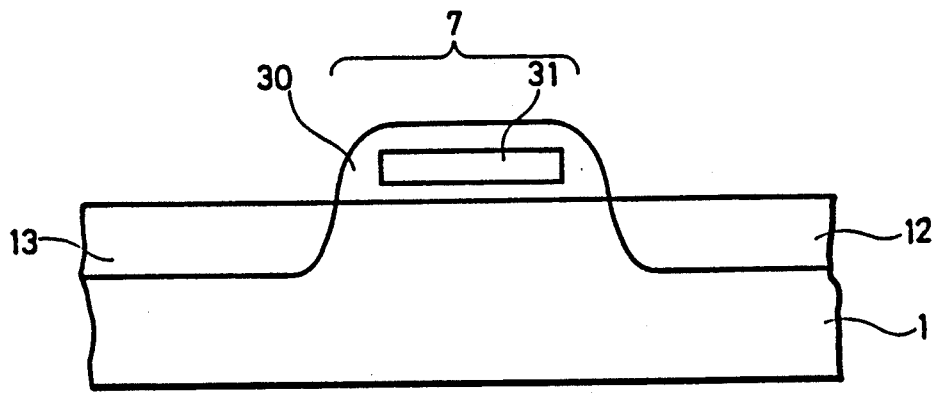
FIG. 8 is a cross sectional side view of the element separation region of the LDD MOS transistor shown in FIG. 7, looking in the Y direction.
Figure 9:
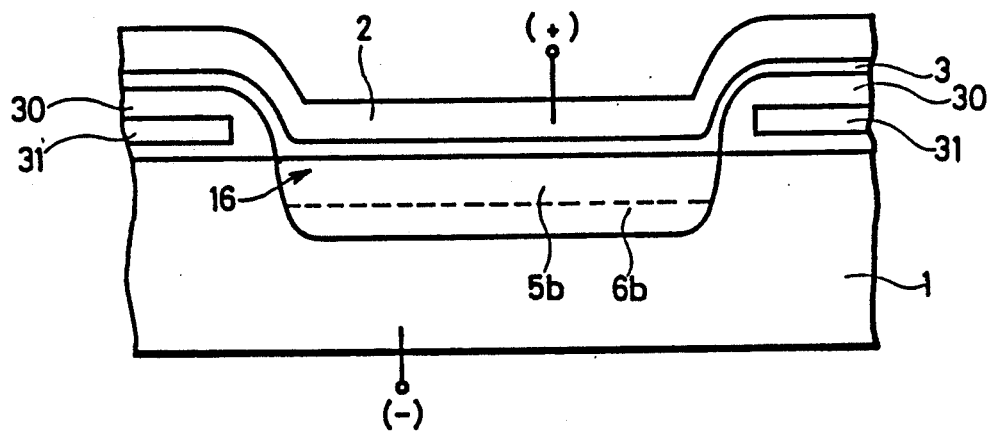
FIG. 9 is a cross sectional side view of the LDD MOS transistor shown in FIG. 7, looking in the X direction.

FIG. 8 is a cross sectional side view of the element separation region 7 of the LDD MOS transistor shown in FIG. 7, looking in the direction of the arrow mark X, wherein there are shown the element separation region 7 including the electrostatic screening electrode 31 and the insulating film 30 substantially enclosing the electrode 31, a diffusion layer 12 of a first transistor and a diffusion layer 13 of a second transistor, wherein the diffusion layers 12 and 13 are formed in the semiconductor substrate on both sides of the element separation region 7. FIG. 9 is a cross sectional side view of the LDD MOS transistor shown in FIG. 7, looking in the direction of the arrow mark X.

The operation of the above described LDD MOS device is hereinafter explained. The transistor of the present invention is similar to the conventional transistor in that it is operated with the source electrode grounded, the substrate being used as the electrode having a fixed (−) potential, and the (+) potential being applied to the drain region and the gate electrode. However, the transistor of the present invention features using the electrostatic screening electrode for separating the elements or devices from one another. As shown in FIG. 8, the electrostatic screen electrode 31 is formed on the semiconductor substrate surface between the diffusion layer 12 of the first transistor and the diffusion layer 13 of the second transistor by way of the insulating film 30, just like the gate electrode in a MOS transistor.

The electrode 31, formed similarly to the gate electrode of the MOS transistor as described hereinabove, is able to control the electrical field, that is, the carrier concentration, between the diffusion layer 12 of the first transistor and the diffusion layer 13 of the second transistor formed on both sides of the electrode 31 on the substrate. Thus, by fixing the potential of the electrode 31 so as to be not higher than the threshold voltage of the gate of a transistor the channel of which is assumed to exist between the diffusion layers 12 and 13, no current flows between the first and second transistors, so that these two transistors are isolated from each other. By applying the above potential, the electrical field on the semiconductor substrate continues to be fixed, even when the gate electrode 2 or other wiring is formed on the element isolation region 3 and the voltage is applied thereto, so that the fluctuations in the electrical field are minimized and hence any adverse effect on the element isolation may be eliminated.

Figure 3:
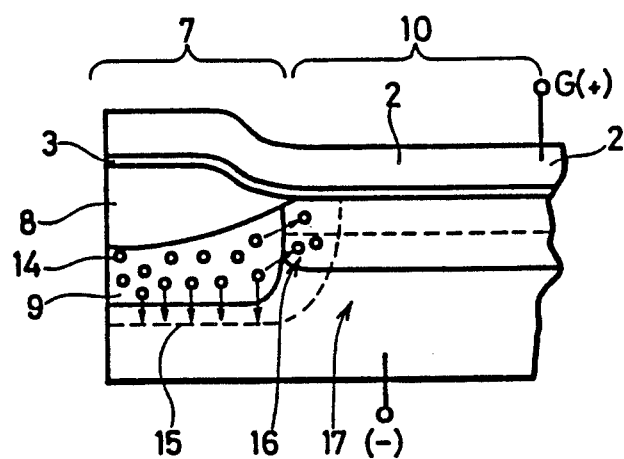
FIG. 3 is a sectional view showing the LDD MOS transistor of FIG. 1, looking in the X direction.

When the transistor devices or elements are isolated from each other in this manner, no impurity diffusion layer for preventing field inversion as shown in FIG. 3 is formed in the boundary region between the element isolation region 7 and the impurity diffusion layers 5a, 5b, 6a and 6b acting as the source and the drain regions of the transistor at the channel end 16, as shown in FIG. 9, so that no impurities are intruded from this region into the element forming region 10. Thus, the channel widths of the MOS transistor may be prevented from being lowered from the design value by the intrusion of impurities, while it becomes possible to suppress the narrow channel effects that may give rise to instabilities of the gate threshold voltage. In addition, it becomes possible to prevent instabilities in the concentration of the diffusion layers 5a and 5b containing the impurities at a low concentration, while the effect proper to the LDD MOS transistor of suppressing the fluctuations in the gate threshold voltage otherwise caused by hot electrons upon relaxation of the electrical field between the source and drain regions, may be augmented.

It is noted that the above effects are most pronounced in case of an extremely small transistor channel length of less than 1μm. By virtue of the above described stabilizing effects, it becomes possible to produce a DRAM composed of memory cells each having a channel length L1 of approximately 0.6μm as shown in FIG. 7.

Although the N channel LDD MOS transistor is shown in the above embodiment in which the N type diffusion layers are used in the source and drain regions, it should be noticed that the similar deterioration in the transistor characteristics may be prevented when the P channel LDD MOS transistor is used in the source and drain regions.

Figure 10:
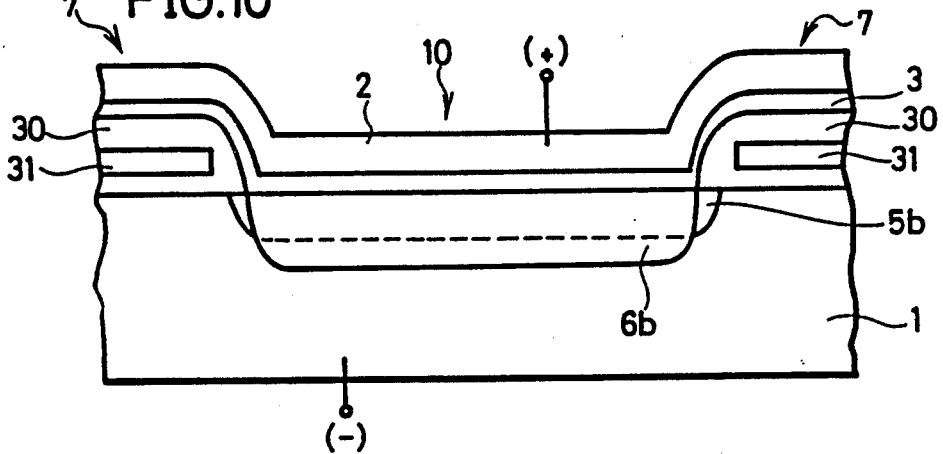
FIG. 10 is a cross sectional side view showing a modification of the present invention.

Also, by forming the first diffusion layer 5b of the lower concentration at the boundary region between the element isolation region 7 and the element forming region 10 in the course of formation of the LDD MOS transistor, as shown, in FIG. 10, so that no portions of the layer 5b are overlapped with the second diffusion layer 6b of the higher concentration, the electrical field of the element isolation region may be relaxed to improve the element isolation characteristics.

It is to be noted that the semiconductor device of the present invention may be applied to any transistor as long as it is of the MOS type.

As described hereinabove, by employing the method of using the electrostatic screening electrode for element isolation, it becomes possible to produce a semiconductor device of high performance and high reliability which is free from the intrusion of impurities from the element isolation region, as well as to achieve a higher integration of the electronic circuits.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A semiconductor device comprising:
    a semiconductor substrate including a plurality of element forming regions in each of which a semiconductor element is formed, and an element isolation region surrounding the periphery of said element forming regions in a non-overlapping manner for isolating said element forming regions;
    a gate electrode formed on said element forming regions with an intervening gate insulating film formed therebetween, said gate electrode having opposed sidewalls;
    sidewall insulating films formed in contact with said sidewalls of said gate electrode;
    first impurity diffusion regions of a first impurity concentration formed on the surfaces of said element forming regions, said diffusion layers extending from said element isolation region to said gate electrode; and
    second impurity diffusion regions of a second impurity concentration higher than said first impurity concentration formed on the surface of said element forming regions, said diffusion layers extending from said element isolation region to said sidewall insulating film,
    said element isolation region being formed on the surface of said semiconductor substrate and including an insulating film and an electrostatic screening electrode layer spaced apart from said element forming regions for electrostatically screening adjacent ones of said element forming regions from one another.
2. A semiconductor device comprising:
    a semiconductor substrate including a plurality of element forming region in each of which a semiconductor element is formed, and an element insolation region surrounding the periphery of said element forming regions in a non-overlapping manner and isolating said element forming regions from one another;
    words lines formed on said semiconductor substrate and bit lines intersecting said word lines; and
    memory cells formed in said element forming regions at the intersections between said word lines and the bit lines;
    each of said element forming regions including
    a gate electrode formed on said semiconductor substrate with an intervention gate insulating film, said gate electrode having opposed sidewalls;
    sidewall insulating films formed in contact with said sidewalls of said gate electrode;
    first impurity diffusion regions of a low impurity concentration formed on the surface of said element forming region for extending from said element isolation region to said gate electrode; and
    second impurity regions of a high impurity concentration higher than said low impurity concentration and formed on the surface of said element forming regions extending to said sidewall insulating films;
    said element isolation region including an insulating film formed on the surface of said semiconductor substrate, and including an electrostatic screening electrode layer spaced apart from said element forming regions on said insulating film for electrostatically screening adjacent ones of said element forming regions from one another.
3. A semiconductor device according to claim 2, wherein
    length of the gate electrode (2) is no more than 1.0μm.
4. The semiconductor device according to claim 2, wherein
    the gate electrode (2) has length of approximately 0.6μm.
5. A semiconductor device according to claim 1, wherein said electrostatic screening electrode is spaced apart from said second impurity diffusion regions.
6. A semiconductor device according to claim 1, wherein said electrostatic screening electrode is spaced apart from said second impurity regions by a distance of between 0.1 and 0.2 μm.
7. A semiconductor device according to claim 2, wherein said electrostatic screening electrode is spaced apart from said second impurity diffusion regions.
8. A semiconductor device according to claim 2, wherein said electrostatic screening electrode is spaced apart from said second impurity regions by a distance of between 0.1 and 0.2 μm.
9. A semiconductor device comprising:
    a semiconductor substrate (1) having a major surface and including an element forming region (10) in which a semiconductor element is formed, and an adjacent element isolation region (7);
    a gate electrode (2) formed on said element forming region of said substrate with an intervening gate insulating film (3) formed therebetween;
    sidewall insulating films (4) formed on opposite side walls of said gate electrode on said element forming region of said substrate;
    first impurity diffusion regions (5a and 5b) of a first impurity concentration formed spaced apart in said element forming region of said substrate under respective ones of said sidewall insulating films; and
    second impurity diffusion regions (6a and 6b) of a second impurity concentration higher than said first impurity concentration formed on opposite outer sides of respective ones of said first impurity diffusion regions in the major surface of said element forming region of said substrate,
    said element isolation region (7) being formed on the major surface of said semiconductor substrate (1) adjacent to said second impurity regions and including an insulating film (30) and an electrostatic screening electrode layer (31) laterally spaced apart from said element forming region (10) for electrostatically screening said element forming region (10).

10. A semiconductor device according to claim 9, wherein said electrostatic screening electrode is spaced apart from said second impurity diffusion regions.

11. A semiconductor device according to claim 9, wherein said electrostatic screening electrode is spaced apart from said second impurity regions by a distance of between 0.1 and 0.2 $\mu$m.

12. A semiconductor device according to claim 9, wherein said element isolation region surrounds a periphery of said element forming region.

13. A semiconductor device according to claim 9, wherein said first impurity diffusion regions are formed spaced apart in said element forming region of said substrate by a distance of no greater than 1.0$\mu$m.

14. A semiconductor device comprising:
a semiconductor substrate (1) having a major surface including an element forming region (10) and an adjoining element isolation portion (7), said element forming region including adjoining left, central and right portions extending from said element isolation region of said substrate to a side of said element forming region opposite said element isolation portion, said left and right portions of said element forming region formed on opposite sides of said central portion of said element forming region;
a gate electrode (2) formed on said central portion of said element forming region of said substrate with an intervening gate insulating film (3) formed therebetween;
first and second sidewall insulating films (4) formed on opposite side walls of said gate electrode on said central portion of said element forming region of said substrate;
first and second low impurity diffusion regions (5a and 5b) of a first impurity concentration formed spaced apart in said central portion of said element forming region of said substrate under said first and second sidewall insulating films, respectively;
first and second high impurity diffusion regions (6a and 6b) of a second impurity concentration higher than said first impurity concentration respectively formed in said left and right portions of said major surface of said element forming region of said substrate, adjoining said first and second low impurity diffusion regions, respectively; and
an element isolation region (7) formed on the major surface of said element isolation portion of said semiconductor substrate (1) adjacent to said high impurity regions and including an insulating film (30) and an electrostatic screening electrode layer (31), said electrostatic screening electrode formed spaced apart from said element forming region (10) of said substrate.

15. A semiconductor device according to claim 14, wherein electrostatic screening electrode is spaced apart from said second impurity diffusion regions.

16. A semiconductor device according to claim 14, wherein said electrostatic screening electrode is spaced apart from said second impurity regions by a distance of between 0.1 and 0.2$\mu$m.

17. A semiconductor device according to claim 14, wherein said element isolation region surrounds a periphery of said element forming region.

18. A semiconductor device according to claim 14, wherein said low impurity diffusion regions are formed spaced apart in said element forming region of said substrate by a distance of no greater than 1.0$\mu$m.

19. A semiconductor device according to claim 14, wherein said low impurity diffusion regions are formed spaced apart in said element forming region of said substrate by a distance of approximately 0.6$\mu$m.

20. A semiconductor device according to claim 14, wherein said left, central and right portions of said element forming regions extend in a direction substantially perpendicular to an interface of said element forming region and said element isolation portion.

* * * * *